IMAGE FIXATION IN PHOTOCHEMICAL REPRODUCTION PROCESS
Filed March 20, 1968
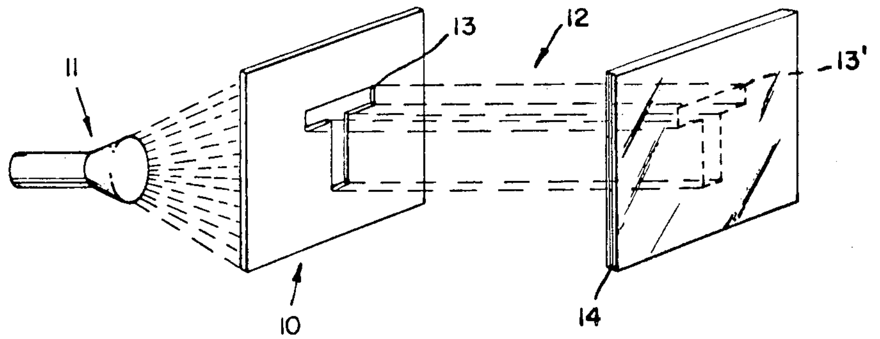

United States Patent Office 3,726,688

Patented Apr. 10, 1973

3,726,688
IMAGE FIXATION IN PHOTOCHEMICAL REPRODUCTION PROCESS

John B. Rust, Los Angeles, Calif., assignor to Hughes Aircraft Company, Culver City, Calif.

Filed Mar. 20, 1968, Ser. No. 714,596
Int. Cl. G03c 5/00, 1/68
U.S. Cl. 96—115 P 26 Claims

ABSTRACT OF THE DISCLOSURE

In a photosensitive composition having a pH greater than 7 and comprising as a composite whole (a) a monomer polymerizable by addition and condensation reactions, (b) a latent catalyst alterable by heating to form an acid in the presence of water, and preferably (c) a photocatalyst system capable of inducing addition polymerization of the monomer when irradiated with actinic light, the method, for example, comprising (1) irradiating the basic photosensitive composition in the presence of water with heat or actinic light to form an image and (2) treating the photosensitive composition to cause the latent catalyst to form an acid to condensation polymerize the remaining monomer, and also effect the production of multiple colored imaging of the composite.

This invention relates to the formation and fixing of photopolymer images produced by photochemical polymerization of photopolymerizable monomers, compositions therefor, and products thereof. More particularly, this invention relates to a process for forming and fixing photopolymer images in photosensitive monomeric media containing monomers capable of both condensation and addition polymerization, including the production of multiple colored imaging thereby and the products thereof.

The formation of an image upon exposure of photosensitive polymerizable media to energy of suitable wavelength must be followed by desensitization of the unexposed areas of such photosensitive media. Retention for reflection or projection in multiple and varied coloring has been desired in the art. If the unexposed areas of such photosensitive media are not desensitized, further exposure of these areas to actinic light will cause the monomer in these initially unexposed areas to polymerize, thereby decreasing or destroying the definition of the desired image, when desired to be retained as a composite whole of the composition. Generally, desensitization is accomplished by removing the unexposed material by washing with a suitable solvent. This method has the disadvantages of requiring extremely careful handling of the photosensitive media and further requiring extended processng under darkroom conditions. An improved method of desensitive media and further requiring extended processing the unexposed material with an agent capable of rendering the unexposed material light insensitive, as described, for example, in co-pending applications entitled "Photopolymer Polymerization Fixation Process and Products," Leroy J. Miller and John B. Rust, Ser. No. 583,650, now Pat. No. 3,531,282, and "Photopolymer Fixation Process and Products." John B. Rust, Ser. No. 583,649, now Pat. No. 3,531,281. Although the desensitization methods described in the aforementioned co-pending patent applications are substantial improvements over the desensitizing methods of the prior art, some polymerization of the monomer in the initially unexposed areas may occur if the desensitizing agent is not properly dispersed throughout the photosensitive media, or by improper handling.

The desensitizing method of this invention is applicable to a composite of photosensitive meda comprising polymerizable monomers capable of undergoing both condensation and addition polymerization in combination with a catalyst mixture. These monomers are further characterized by being capable of polymerizing by only one of these polymerization methods at certain distinct pH ranges of the photosensitive media. To alter the pH of the photosensitive media and thereby control the type of photopolymerization process, a latent catalyst, which is stable in basic media and which is capable of being altered to form an acid when heated is included in the photosensitive media used herein.

After a desired photopolymer image has been formed in the photosensitive media of this invention by addition polymerization by exposing the photosensitive media to actinic light, normally in the wavelength range of about 3800 A. to about 7200 A., the photosensitive media are heated to cause the latent catalyst to produce an acid which lowers the pH of the photosensitive media and initiates condensation polymerization of the remaining monomer in the photosensitive media. Thus, as compared with the prior art which relied on the physical difference between monomer and polymerized monomer to produce an image, the method of this invention relies on the composite mixture of physical difference between fixed condensation-polymerized and addition-polymerized monomers in the multiple solid state composite of the photosensitive composition, and to effect a color difference in composite images therein. In doing so, the method of this invention polymerizes all of the monomer in the photosensitive media, that is, both the image and background areas of the photosensitive media are polymerized.

By polymerizing all of the monomer, no monomer remains to undergo polymerization when the photosensitive media are further exposed to actinic light. Therefore, the initially-formed, photopolymer image will not be distorted when the photosensitive media are re-exposed to actinic light. Furthermore, even though the addition polymers may undergo some further polymerization by condensation reaction and even though the condensation polymers may undergo some further reaction by addition polymerization, the resulting products will not distort the photopolymer image because they are physically similar to the original addition and original condensation polymers, respectively.

In the broader sense of photosensitive polymerization of condensation and addition polymerizable ethylenically unsaturated monomer and polymer material containing an ethylenic group or groups capable of forming dense inactive high polymers by photo-initiated addition polymerization in the presence of a light activated polymerization catalyst material, that is quiescent in the dark, the embodiment thereof herein includes a secondary catalyst inactive in the light and inducing condensation polymerization initially, terminally, or simultaneously and with use of a photoactivable dye or mixture of such and other dye material to obtain an image replica in film form and in multiple coloring in the composite of polymerization. While multiple coloring is obtainable by the control of areas of light polymerization in the image with condensation polymerization of the balance of the film, a further modification is provided by mixing in the film composition another dye material to obtain a color contrast, in the presence of natural, artificial and/or ultraviolet light.

Because the latent catalyst and, if desired, coloring catalyst, with or without a non-catalytic color or color modifying material, is preferably added to the photosensitive composition prior to the image-forming step, no further mixing or addition handling of the photosensitive composition is required after the initial formulation. Additionally, photosensitive photocatalyst systems may be added to the photosensitive media to increase the rate of the addition reaction without adversely affecting the condensation reaction. Thus, very clear contrasting color or multiple color images for reflection or projection can be provided by variously colored dye material according to their proportional use or concentration in the photosensitive media. For example, an indio yellow color may be mixed with an excess of the methylene blue photosensitive catalyst to produce a green portion in the condensation polymerized area whereas a light yellow to white area is produced in the addition polymerized area, or vice versa, as will be herefrom apparent. Additional coloring by dye materials and mixtures of different colorings to produce the color or colors desired are known to the art. In addition, phototropic dye coloring activated by a secondary radiation source, as ultraviolet when incorporated in the polymerizable monomer mixture enables a further modification of color image projection.

It has been found that some monomers will undergo both addition and condensation polymerization. Furthermore, it has been found that the addition polymers of some of these monomers markedly differ from the condensation polymerization reactions and the condensation polymers, including color, change and retention, respectively. It is with this monomer material that the process of this invention relies on for the differences between reaction characteristics and the differences between polymer characteristics to fix or desensitize a photosensitive medium containing monomers capable of both addition and condensation polymerization—hereinafter designated addition-condensation monomers. Thus, the herein-described process promotes one type of polymerization while retarding the other type of polymerization at each stage of the process. In addition, it is now discovered that a composite uniform resinous film of contrasting image coloring and multiple imaging is obtainable for visual and projection viewing.

More specifically, the process of this invention employs a photopolymerizable monomer capable of undergoing both addition and condensation polymerization, in conjunction with a latent catalyst capable of altering the pH of the photosensitive medium (in the presence of water) so that the addition-condensation monomer will undergo only addition or only condensation polymerization at any given stage of the herein-described process. Initially, the pH of the photosensitive medium is adjusted in the basic pH range so that photopolymerization of the monomer will take place by addition polymerization to produce a photopolymer image when the photosensitive composition is initially irradiated with actinic light, but condensation polymerization is inhibited under basic pH conditions. Following this step, the pH is changed by heating the photosensitive medium, thereby altering the pH by altering the latent catalyst. At the new pH condensation polymerization will readily and quickly take place when the photosensitive composition is heated. Therefore, a condensation reaction is effected to polymerize the initially unexposed portion of the photosensitive medium and render the latter essentially insensitive to further polymerization when further exposed to actinic light, because the monomer now has already been fully polymerized by condensation polymerization. Thus, I have discovered a method of providing solid mixed polymer films of photosensitive composite mixtures of addition and condensation type polymerizable monomeric material which can be cured to a composite solid state with or without multiple coloring of an image cast therein, as is illustrated herein.

It has been found that monomers suitable for use in the process of this invention will undergo addition polymerization when subjected to appropriate light radiation when the pH of the photosensitive medium is near or above pH 7. Below pH 7, the addition reaction is very slow. As the pH increases above 7, the addition reaction rate increases and the efficiency of the reaction increases. Preferably, the pH is adjusted to a value of about 8.

The monomers usable in the process of this invention will also sluggishly undergo condensation polymerization when heated at pH's greater than 7. However, the rate of condensation polymerization at pH's greater than 7 is extremely slow, making the use of pH's greater than 7 quite impractical where it is desired to polymerize by condensation reactions. In order to obtain rapid condensation polymerization, the pH of the photosensitive medium must be maintained at a pH less than 7. A pH less than 7 must be used in the condensation reaction step.

The rate at which the condensation reaction progresses is a function not only of pH but also of the temperature of the photosensitive medium. In general, as the temperature increases, the rate of condensation polymerization increases, although, as the pH is raised towards 7, the rate increase due to the increase in temperature will be offset somewhat by the pH increase. However, it is believed that the rate of the condensation reaction is determined primarily by the temperature of the photosensitive medium provided that the pH is below 7. It has been found that the condensation polymerization step can be completed in a few minutes at a temperature of about 80° C. and at a pH of 4. As the pH is increased toward pH 7, at a temperature of 80° C., the rate of condensation polymerization decreases slightly. However, at pH's greater than 7 (T=80° C.), the rate of condensation polymerization is impractically low.

The temperature required to produce rapid condensation polymerization is subject to an additional factor. This factor is the identity of the addition-condensation monomer. Some monomers require a higher temperature than other monomers to produce the same rate of condensation. However, regardless of the identity of the addition-condensation monomer, the temperature to which the photosensitive composition is heated in the acidification step, will be limited by the boiling temperature of the lowest boiling component in the photosensitive composition. Usually the limiting temperature will be the boiling temperature of water. From the foregoing, it can be seen that the following major factors govern the speed of the condensation reaction temperature, pH and identity of the particular addition-condensation monomer. The complex interrelation among these factors necessitates that one or two of these factors be initially set and that the other factor(s) be determined therefrom. It is preferred that the latent catalyst (pH related) and the addition-condensation monomer be chosen initially. The temperature of the photosensitive medium during the condensation step can then be chosen to provide rapid condensation.

From the foregoing, it will be evident that by changing the pH of the photosensitive medium the type of polymerization reaction which the monomer is capable of participating in will also change. To further illustrate the mode of operation of the process of this invention, the addition polymerization and condensation polymerization of methylol methylene bisacrylamide monomer (an addition-condensation monomer usable in this invention) will be described in conjunction with the drawing illustrating a manner of imaging recording, or projection, with the aid of idealized equations.

With the latent catalyst in its non-acidic form, that is, when the pH of the photosensitive medium is above about pH 7, the addition-condensation polymerizable monomer material as methylol bisacrylamide undergoes the following reaction when the photosensitive medium is irradiated with light of appropriate wavelength i.e., actinic light, in a desired pattern:

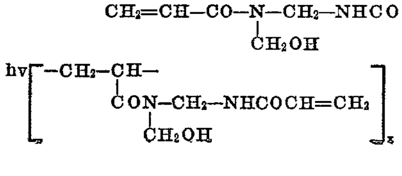

(plus cross linking) (1)

The photosensitive medium is heated to lower the pH below 7, simultaneously inducing the condensation polymerization shown by (2):

$$CH_2{=}CH{-}CO{-}\underset{\displaystyle CH_2OH}{\underset{|}{N}}{-}CH_2{-}NHCOCH{=}CH_2 \xrightarrow{\text{Heat}} {-}\left[{-}CH_2{-}\underset{\displaystyle COCH{=}CH_2COCH{=}CH_2}{\underset{|}{N}}{-}CH_2{-}N{-}\right]_y + (y-1)H_2O \quad (2)$$

The condensation polymer thus produced is a clear, transparent gel, thereby distinguishing from the addition polymer produced as in (1) by differences in solubility, refractive index, density and the like. Thus, it is evident that the integrity of the addition polymer image is maintained even though that portion of the photosensitive medium initially unexposed to light undergoes condensation polymerization.

The addition polymer as produced in Equation 1 may undergo further polymerization by condensation polymerization when heated. Similarly, the condensation polymer, produced as in Equation 2, can undergo addition polymerization when exposed to light. However, the essential characteristics of the addition and condensation polymers initially formed are not appreciably altered by further polymerization or by condensation and addition reactions, respectively. Thus, the integrity of the image formed as in Equation 1 is preserved even though the image polymer and the polymer produced in the desensitizing step (2) undergo further polymerization, because of differences in solubility, refractive index, density and the like.

As will now be recognizable to the art, it is by utilization of the differences in polymerization technique that different mixtures of dye materials either active or inactive in the presence of natural and/or artificial light or radiation now provides for new combination of coloring and coloring contrasts in polymer film materials.

Although the characteristics of the polymers remain essentially unaltered by further polymerization by another type of polymerization reaction, certain precautions should be exercised when forming the basic polymers in order to produce a well-defined image. When exposing the photosensitive medium to an information-bearing energy source to form an image therein, the photosensitive medium should not be heated even though the pH is greater than 7. This precaution should be taken because some condensation of the monomer will take place at pH's greater than 7 when heat is applied to the photosensitive medium, although the condensation polymer so produced may be sufficient to reduce image definition.

The monomer will also undergo addition polymerization during the desensitizing step (2) if this step is performed in the presence of a radiant energy source, such as for example, room light. Such a reaction will also tend to reduce image definition. Therefore, it is necessary that the condensation reaction (2) be carried out under conditions, for example, darkroom conditions, when a visible light-sensitive composition is used.

As noted previously, the monomers usable in the process of this invention must be capable of undergoing both addition and condensation polymerization. To produce a well-defined image, the condensation and addition polymers should exhibit significantly different physical characteristics, Preferred monomers which satisfy these requirements are the methylol derivatives of aliphatic organic amides comprising at least one reactive vinyl group.

Preferably, the monomers are the methylol derivatives of the acrylamides. In these monomers, at least one hydrogen on the amide group is replaced by a methylol substituent. If only the non-substituted acrylamide is available, the methylol derivative may be obtained by reacting formaldehyde with the acrylamide in a basic medium. For example, formaldehyde may be reacted with an acrylamide at a pH greater than 7 to produce methylol acrylamide derivatives.

Specific examples of the monomers which can be used in the process of this invention are: methylol acrylamide, methylol methacrylamide, dimethylol methacrylamide, methylol N-vinyl acetamide, methylol methylene bisacrylamide, and mixtures thereof, and the like. However, as otherwise contemplated herein, are the other olefinically unsaturated photosensitive polymerizable compounds, including mixtures thereof, capable of condensation and addition polymerization and useful in the combination of mixtures of catalyst and color contrast as embodied herein.

The photosensitive and condensation monomers may be added directly to the photosensitive medium and catalyst combination, or it may be added indirectly as a combination of acrylamide and aldehyde as shown by the example. Additionally, the monomers may be added to the other components in the photosensitive medium in any order.

However, once the monomer, or monomer mixture, has been added to any of the other light sensitive components, all further mixing must be performed in the dark to prevent undesired additional polymerization of the monomer.

The latent catalyst employed in this inventtion is a compound capable of being hydrolyzed to an acid form upon the application of heat. For example, methyl p-toluene-sulfonate, sodium monochloroacetate, methyl monochloroacetate, sodium $\alpha,\beta$-dibromopropionate, glycerol dichlorohydrin, glycerol monochlorohydrin, ethylene chlorohydrin, and mixtures thereof, and the like may be used. As the latent catalyst hydrolyzes, the pH of the photosensitive medium decreases.

Because the process of this invention is dependent upon the hydrolysis of the latent catalyst to its acidic form, water must be present in the photosensitive medium when hydrolysis takes place. The amount of water necessarily present in the photosensitive medium will depend upon the amount of latent catalyst present. In general, stoichiometric amounts of water relative to the amount of latent catalyst present in the photosensitive medium are sufficient to hydrolyze the latent catalyst. However, initially there need be only trace amounts of water present in the photosensitive medium. Such amounts have been found sufficient to produce enough of the acid form of the latent catalyst to initiate condensation polymerization. Once condensation polymerization commences, the water derived therefrom can react with the latent catalyst to further hydrolyze the catalyst. Thus, in a substantially homogeneous photosensitive medium, the latent catalyst hydrolysis-condensation reactions are essentially self-sufficient with respect to the water necessary for hydrolysis of the latent catalyst.

Where water is added to the photosensitive medium, it is preferably included in the initial composition of the photosensitive medium as shown in the example. However, water may also be added to the photosensitive medium by including an agent which absorbs water from the atmosphere (humectant) provided that such agent does not noticeably interfere with the definition of the photopolymer image. For example, ethylene glycol and glycerine may be used as humectants. In addition, such photosensitive mixtures may be prepared in independent film form or as compositions coated on a suitable transparent or non-transparent backing. Suitable, resin, metal foil, and cellulosic backing materials are known to the art.

The rate of photopolymer image production is preferably increased by employing, in combination with the addition-condensation monomer, a photo-polymerization catalyst such as the photo-redox catalyst systems described in my copending patent applications entitled "Photo-Polymers and the Process of Making Same," Ser. No. 450,397 now abandoned and 824,903, continuation-in-part of 483,-986 (abandoned) filed Apr. 23, 1965, and Aug. 31, 1965, respectively, and assigned to the instant assignee (hereafter designated "my co-pending applications"). The photo-redox catalyst systems disclosed in my co-pending applications are incorporated herein by reference thereto.

These photo-redox catalyst systems include a photo-oxidant and a catalyst. For example, the photo-oxidants include: the quinoidal dyes such as phenothiazine dyes, phenazine dyes, acridine dyes and xanthene dyes.

The catalysts include: organic sulfinic acids and derivatives thereof such as p-toluenesulfinic acid, benzene-sulfinic acids, p-bromobenzenesulfinic acid, naphthalenesulfinic acid, 4-acetamidobenzenesulfinic acid, 5-salicylsulfinic acid, ethanesulfinic acid, 1,4-butanedisulfinic acid, and α-toluenesulfinic acid. Salts of these organic sulfinic acids which are compatible with other components in the light-sensitive composition such as the sodium salts, the potassium salts, the lithium salts, the magnesium salts, the calcium salts, the barium salts, the silver salts, the zinc salts and the aluminum salts. Esters of the organic sulfinic acids such as the methyl esters, the ethyl esters, the propyl esters and the butyl esters; halogen derivatives of the organic sulfinic acids such as the sulfinyl chlorides and bromides. For example, ethanesulfinyl chloride and 5-salicylsulfinyl bromide; and organic sulfinic amides such as the sulfinamides, for example, ethane-sulfinamide, the N-alkylsulfinamides, for example, N-methyl-p-toluenesulfinamide, and the N-arylsulfinamides, for example, N-phenyl-benzene-sulfinamide. Triorgano-substituted phosphines such as tributyl phosphine, triphenyl phosphine, dibutylphenyl phosphine, methyl diphenyl phosphine, and methyl butylphenyl phosphine; and triorgano-substituted arsines such as triphenyl arsine, methyl diphenyl arsine, trioctylarsine, dibutylphenyl arsine and methylbutylphenyl arsine or suitable mixtures of such catalyst and the like.

Other photo-redox catalyst systems with the composite of photosensitive addition and compensation polymerizable monomeric and polymeric materials may also be used in obtaining the composite of solid film, as herein provided. For example, I may use rose bengal, phloxine, erythosine, eosin, fluoroescine, acriflavine, and thionine and methylene blue, and mixtures of the same as photo-oxidants and I may use stannous chloride, ascorbic acid, hydrazine, phenyl-hydrazine, and dichlorophenyl-hydrazine, and mixtures of the same, as reducing agents. In addition, I may use suitable acid or basic dyes active in relationship to the base or acid condition of the initial polymerization and the final solid film forming polymerization to effect contrasting colors and mixtures of colors in the resultant, imaging photosensitized composite.

The formation of a photo-polymer image by differential polymerization, as addition polymerization and the desensitization of initially unpolymerized areas of the photosensitive medium by condensation polymerization, or simultaneously or in an alternative order are illustrated by the following examples. Included therewith, is an illustrative example of the method provided herein for obtaining a color contrast in photopolymer imaging.

EXAMPLE 1

An N-methylol methylene bisacrylamide solution (solution A) was prepared by first admixing the following:

15.4 gms. of N,N'-methylene bisacrylamide, 13.4 ml. of 37% aqueous formaldehyde, 17.9 ml. of aqueous disodium hydrogen phosphate—citric acid buffer solution at pH 8, and 0.5 gm. of potassium hydroxide.

Solution A was then heated for 5 hours at 50–60° C. Thionine was then added to give a $10^{-4}$ molar concentration of the dye.

A second monomer solution (solution B) was prepared as follows:

A mixture of 40 gms. of acrylamide and 6 gms. of N,N'-methylene bisacrylamide was made up to a volume of 100 ml. with a buffer solution composed of dissodium hydrogen phosphate and citric acid at pH 8. Sufficient thionine was added to make a solution $10^{-4}$ molar in the dye.

From the above two solutions, a third solution (solution C) was prepared, consisting of:

6.5 ml. of solution A, 2.5 ml. of solution B, and 0.25 gm. of monochloroacetic acid. A clear solution resulted by stirring and blending 5 ml. of solution C and 0.5 ml. of 0.1 molar aqueous sodium p-toluenesulfinate.

Solution C was placed in a closed Plexiglas cylindrical cell and nitrogen was passed through the cell to lower the oxygen content of the solution.

The solution was exposed to light through a photographic negative of a human subject for a few minutes using illumination having a maximum light intensity of .0124 watt per square centimeter. An image was created by the appearance of light scattering colloidal particles. While still in the dark, the cell was heated to 40°–50° C. for 15 minutes. After this treatment, the image could be viewed with full illumination and did not fade, become light struck or fog upon storage at any light level. The image was plainly discernable by transmitted light as a black and white print.

This example illustrates the formation of a colloidal, photopolymer image from a monomer mixture of addition-condensation monomers as methylol derivatives of acrylamide and N,N'-methylene bisacrylamide and the subsequent desensitization of the surrounding photosensitive material by heating the still photosenstive medium to lower the pH to thereby promote condensation polymerization of the previously unexposed monomer. Similar results are obtained by substitution of the indicated other monomers, mixtures thereof and reagents in the above example.

EXAMPLE 2

Utilizing the above prepared mixture of C in combination with a substituted dye composition of:

| | Gram |
|---|---|
| Methylene blue | .02 |
| Photochromic dye | .02 |

The water soluble photochromic dye, for example, sulfonated triaryl leuco cyanide or leuco malachite green cyanide was added in an equivalent amount to the methylene blue. Initially, a relatively colorless monomer mixture with a slight blue tinge was obtained. Upon illumination of negative 10 by a conventional light source 11, and effecting passage of light rays 12 through a formed opening 13, the balance of the negative blocking light rays, the image 13 was formed by an initial polymerization in the above mixture, prepared as the thin film of .066 inch thickness between two glass plates sealed with a peripheral shim about the edge of the plates (not shown, as such). After exposure and initial or addition polymerization, the film 14 was heated to about 80° C. and the balance of the film fixed by condensation polymerization, as embodied herein. The resultant film retained the slightly bluish cast in the background or condensation polymerized portion and no cast in the addition or initial polymerized portion. However, when projected by a combination of white light containing ultraviolet, the image configuration was outstanding in green color in the initially polymerized portion with a mixture of blue-green in the other polymerized or background portion.

EXAMPLE 3

An additional sample of the polymerizable mixture of Example 2 prepared in film form, as described, was treated with ultraphonic rays (infrared) passing through the opening 13, to effect an initial heat polymerization of the representative image. This was followed by exposing the whole of the film to normal light rays and effecting apparently light polymerization hardening of the composite film without destroying the representative differentially image polymerized portion therein.

In another experiment, when a like film was irradiated in a similar manner with heat rays in combination with ultraviolet rays, the image was polymerized in the color of the phototropic dye material and the background, when the whole was exposed to light, polymerized substantially without color, as indicated. When projected by white light in combination with ultraviolet, the condensation polymerized portion appeared in a lighter shade, apparently in view of the acid condition effected by heating, inducing a reduction in color of the phototropic dye. Thus, providing a uniform composite of the differentially polymerized film in the reverse order of polymerization.

In further experimentation, it was found that the color differentials or contrasts depended upon the amount of photosensitive dye material, or dye mixtures present in single or mixed forms therewith, in conjunction with the relative amount of photosensitive dye material present after polymerization, with or without the phototropic or other light inactive color material, as a natural coloring pigment, or dye, being present. Under suitable conditions, wherein a pigment coloring matter of organic or inorganic character, as carbon, zinc oxide, lead oxide, or the like affecting the whole of the overall color of the design polymerization is desired, one or more may be incorporated in the photopolymerizable composition.

In conjunction with the above processing of differentially polymerizable monomers, using a photosensitive polymerization catalyst in combination with a latent acid for differential polymerization, with or without additional coloring material, it was possible to obtain a multiplicity of solid film polymer images by substituting the negative 10 with other negatives, of either transparent or nontransparent character with a design pattern of a ray or beam transmitting or blocking character. Thus, as will be recognized, I was enabled to obtain film imaging by the combination of differential polymerization effected alternatively or conjointly and simultaneously.

Additionally, the addition and condensation polymers produced in the process of this invention differ significantly in physical properties such as solubility, refractive index, density and the like, thereby permitting an image produced by one polymerization method to remain distinguishable against a background polymerized by the other polymerization method. Furthermore, each type of polymer substantially retains its characteristics even though some polymerization of another type subsequently occurs.

Having described the present embodiments of my discovery in accordance with the patent statutes, it will now be apparent that some modifications and variations may be made without departing from the spirit and scope thereof. The specific embodiments described are provided by way of illustration and are illustrative of my discovery, invention or improvements, which are to be limited only by the terms of the appended claims.

What is claimed is:

1. A method for forming a fixed composite photopolymer image in a light sensitive and heat sensitive photosensitive composition having a pH of over about 7 and containing ethylenically unsaturated monomers, said monomers under control of pH conditions being capable of undergoing either addition polymerization or condensation polymerization by light and heat respectively, and said monomers being in combination with (a) a light sensitive addition polymerization catalyst system that is inactive in the dark and reactive in the pH range of over 7 to effect addition polymerization of said monomer composition in the light range of about 3800 angstroms to about 7200 angstroms, and (b) a secondary or latent catalyst inactive to light and capable of being converted to an acid form, and effect condensation polymerization upon the application of heat, the steps consisting of:

(1) irradiating a selected area of said photosensitive composition with actinic light in said wave length range and activating said light sensitive polymerization catalyst system effecting therewith addition polymerization in said selected areas of said photosensitive composition and (2) heating said photosensitive composition to a temperature sufficient to cause said secondary latent catalyst to form an acid to thereby reduce the pH of said photosensitive composition below about pH 7 and effecting thereby condensation polymerization of an unpolymerized monomer area of said photosensitive composition, whereby said selected areas of addition polymerization is relatively fixed in relationship to the condensation polymerization area.

2. A method of claim 1 wherein said monomer is an alkylol derivative of an aliphatic organic amide having at least one reactive vinyl group.

3. The method of claim 1 wherein said monomer is a methylol derivative of an acrylamide.

4. The method of claim 1 wherein said heating is performed in the absence of actinic light.

5. The method of claim 1 wherein said irradiation is performed in combination with heat and effecting a composite film of addition and condensation polymers.

6. A method for forming a fixed addition polymerized photopolymer image area in combination with a condensation polymerized polymer area in a photosensitive polymerizable composition comprising the steps of (1) irradiating a selected pattern area of photosensitive light polymerizable composition having a pH above about 7 and comprising (a) a light sensitive composition containing polymerizable monomer selected from the group consisting of alkylol derivatives of acrylic acid, said monomers each having at least one reactive polymerizable vinyl group, (b) a heat activable catalyst inactive to light and alterable by heating to form an acid reducing the pH of said composition below 7 in the presence of water and effect condensation polymerization of said monomer composition, and (c) a photo-redux catalyst system inactive in the dark and activated by light in the wave length range of from about 3800 angstroms to about 7200 angstroms and effective therewith addition polymerization of said monomer when irradiated with said actinic light in the form of a pattern in effecting addition photopolymer image in said selected pattern area; and (2) heating said photosensitive composition to a temperature sufficient to cause said heat activable catalyst to form an acid to thereby reduce the pH of said photosensitive composition below about pH 7 and effect condensation polymerization in another area of said composition, whereby said composition has different areas of addition polymerization and condensation polymerization in adjacent relationship.

7. The method of claim 6 wherein said monomer is a methylol-amide derivative of acrylic acid.

8. The method of claim 6 wherein said monomer is selected from the group consisting of dimethylolmethacrylamide, methylol acrylamide, methylol methacrylamide, methylol N-vinyl acetamide, methylol methylene bisacrylamide, and mixtures thereof.

9. The method of claim 6 wherein said latent catalyst is selected from the group consisting of sodium monochloroacetate, sodium alpha, beta-dibromopropionate, glycerol dichlorohydrin, glycerol monochlorohydrin, ethylene chlorohydrin, and mixtures thereof.

10. The method of claim 6 wherein said photosensitive composition is heated to a temperature substantially above room temperature but below the boiling point of the lowest boiling component in said photosensitive composition.

11. The method of claim 6 wherein said initial irradiation is performed at room temperature.

12. The method of claim 6 wherein said heating is performed in the absence of said actinic light.

13. The method of claim 6 wherein said photosensitive composition contains, in addition, a humectant.

14. The method of claim 6 wherein said photo-redox catalyst system comprises a photo-oxidant and a catalyst, said photo-oxidant being raised to a photo-active state of irradiation with said actininc light to form polymerization-initiating free radicals in the presence of said catalyst.

15. The method of claim 6 wherein the pH of photosensitive composition is initially at about pH 8.

16. The method of claim 6 wherein said photosensitive composition is heated to about 80° C.

17. A method for forming a photopolymer image in a heat and photopolymerizable composition comprising steps of:

(1) initially irradiating a pattern area of an aqueous photosensitive composition having an initial pH above about 7 and comprising (a) a heat and light sensitive composition containing monomers polymerizable thereby and selected from the group consisting of alcohol derivatives of aliphatic amides, said monomers having at least one reactive vinyl group and contain in admixture with, (b) a latent catalyst inactive in light and convertible by heat to effect an acid condition upon heating, (c) a light active catalyst material selected from the group consisting of an organic sulfinic acid material including ionizable derivative of an organic sulfinic acid material, a triorgano-substituted phosphine, or triorgano-substituted arsine, or a mixture of said catalyst, and (d) a photo-oxidant inactive in the absence of visible light but capable of being raised to a photo-active level sufficient to initiate polymerization of said monomer when irradiated with actinic light having wavelengths lying between about 3800 angstroms and about 7200 angstroms in the presence of said light active catalyst, with said actinic light in the form of a pattern area to produce an addition photopolymer image in said pattern area; and subsequently (2) heating said photosensitive composition to a temperature substantially above ambient temperature but below the boiling temperature of the lowest boiling component in said photosensitive composition to activate said latent catalyst and reduce said pH of said photosensitive composition below a pH of about 7 and effect condensation polymerization of the initially unpolymerized monomer area.

18. The method of claim 17 wherein said monomer is selected from the group consisting of dimethylol methacrylamide, methylol acrylamide, methylol methacrylamide, methylol N-vinyl acetamide, methylol methylene bisacrylamide, and mixtures thereof.

19. The method of claim 17 wherein said latent catalyst is selected from the group consisting of sodium monochloroacetate, sodium alpha, beta-dibromopropionate, glycerol dichlorohydrin, ethylene chlorohydrin, and mixtures thereof.

20. The method of claim 17 wherein said catalyst is selected from the group consisting of an organic sulfinic acid, ionizable derivatives of said organic sulfinic acid, a triorgano-substituted phosphine, a triorgano-substituted arsine, and mixtures thereof.

21. The method of claim 17 wherein said photo-oxidant is a quinoidal dye selected from the group consisting of phenothiazine dyes, phenazine dyes, acridine dyes, xanthene dyes, phenoxazine dyes, pyronine dyes and mixtures thereof.

22. A photosensitive composition comprising (1) a monomer polymerizable by addition and condensation type reactions, said type of polymerization of said monomer being substantially pH dependent, (2) a latent catalyst alterable by heating to form an acid in the presence of water and (3) a photocatalyst system including addition polymerization of said monomer by free radical formation when irradiated with said actinic light.

23. The photosensitive composition of claim 22 wherein said monomers selected from the group consisting of dimethylol methacrylamide, methylol acrylamide, methylol methacrylamide, methylol N-vinyl acetamide, methylol methylene bisacrylamide, and mixtures thereof.

24. The photosensitive composition of claim 22 wherein said latent catalyst is selected from the group consisting of sodium monochloroacetate, sodium alpha, beta-dibromopropionate, glycerol dichlorohydrin, ethylene chlorohydrin, and mixtures thereof.

25. A photopolymerized film image composition composed of the combination of heat and catalyst condensation polymerized polymers formed under a pH condition of below 7 and light addition polymerized polymers formed under a pH condition of above 7 in different areas of addition polymerization and condensation polymerization of olefinic unsaturated photosensitive polymerizable monomers.

26. A photopolymerizable composition having a pH on the order of 8 and containing a combination of light sensitive and heat sensitive polymerizable olefinic unsaturated monomers and a plurality of catalyst consisting of the combination of a photo-catalyst system inactive in the dark and capable of effecting addition polymerization of said monomers in actinic light and an inactive condensation polymerization catalyst activable by heat to effect an acid condition and condensation polymerization of said monomers.

References Cited

UNITED STATES PATENTS

| | | | |
|---|---|---|---|
| 3,330,659 | 7/1967 | Wainer | 96—115 |
| 2,673,151 | 3/1954 | Gerhart | 96—115 P |
| 3,097,096 | 7/1963 | Oster | 96—35.1 |
| 3,331,761 | 7/1967 | Mao | 209—159.23 |
| 3,050,390 | 8/1962 | Levinos et al. | 96—35.1 |
| 3,099,558 | 7/1963 | Levinos | 96—35.1 |

NORMAN G. TORCHIN, Primary Examiner

E. C. KIMLIN, Assistant Examiner

U.S. Cl. X.R.

96—35.1; 204—159.23

(5/69)

UNITED STATES PATENT OFFICE

CERTIFICATE OF CORRECTION

Patent No. 3,726,688 Dated April 10, 1973

Inventor(s) John B. Rust

It is certified that error appears in the above-identified patent and that said Letters Patent are hereby corrected as shown below:

Col. 4, line 70, the right-hand portion of the formula should be -- $NHCOCH{=}CH_2$ --. Col. 7, line 63, "13.4" should be --13.0--.

Col. 12, line 17, "including" should be "inducing--;

Signed and sealed this 25th day of December 1973.

(SEAL)
Attest:

EDWARD M. FLETCHER, JR.
Attesting Officer

RENE D. TEGTMEYER
Acting Commissioner of Patents